(12) United States Patent
Kataoka et al.

(10) Patent No.: US 11,556,853 B2
(45) Date of Patent: Jan. 17, 2023

(54) LEARNING METHOD, MANAGEMENT DEVICE, AND MANAGEMENT PROGRAM

(71) Applicant: TOKYO ELECTRON LIMITED, Tokyo (JP)

(72) Inventors: Yuki Kataoka, Sapporo (JP); Takehito Watanabe, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 315 days.

(21) Appl. No.: 16/857,384

(22) Filed: Apr. 24, 2020

(65) Prior Publication Data

US 2020/0342357 A1 Oct. 29, 2020

(30) Foreign Application Priority Data

Apr. 26, 2019 (JP) .............................. JP2019-086216

(51) Int. Cl.
*G06N 20/00* (2019.01)
*G01J 3/443* (2006.01)
*H01J 37/32* (2006.01)
*H01L 21/67* (2006.01)
(Continued)

(52) U.S. Cl.
CPC .............. *G06N 20/00* (2019.01); *G01J 3/443* (2013.01); *H01J 37/32926* (2013.01); *H01J 37/32935* (2013.01); *H01L 21/67069* (2013.01); *H01L 21/67276* (2013.01); *G01J 2003/2836* (2013.01); *G01J 2003/2859* (2013.01); *G06N 3/126* (2013.01); *H01J 2237/334* (2013.01)

(58) Field of Classification Search
CPC ......... G06N 3/126; G06N 20/00; G01J 3/443; G01J 2003/2836; G01J 2003/2859; H01L 21/67069; H01L 21/67276; H01J 37/32926; H01J 37/32935; H01J 37/32972; H01J 2237/334
See application file for complete search history.

(56) References Cited

U.S. PATENT DOCUMENTS

2016/0225681 A1* 8/2016 Asakura ............ H01J 37/32972
2018/0025894 A1* 1/2018 Asakura ................. G01J 3/443
156/345.24
(Continued)

FOREIGN PATENT DOCUMENTS

| JP | 2003-509839 A | 3/2003 |
|----|---------------|--------|
| JP | 2009-049382 A | 3/2009 |
| JP | 2011-181575 A | 9/2011 |

(Continued)

*Primary Examiner* — Mark R Gaworecki
(74) *Attorney, Agent, or Firm* — Weihrouch IP

(57) ABSTRACT

There is provided a learning method. The method includes performing preprocessing on light emission data in a chamber of a plasma processing apparatus, setting a constraint for generating a regression equation representing a relationship between an etching rate of the plasma processing apparatus and the light emission data, selecting a learning target wavelength from the light emission data subjected to the preprocessing, and receiving selection of other sensor data different from the light emission data. The method further includes generating a regression equation based on the set constraint while using, as learning data, the selected wavelength, the received other sensor data, and the etching rate, and outputting the generated regression equation.

20 Claims, 12 Drawing Sheets

(51) Int. Cl.
*G01J 3/28* (2006.01)
*G06N 3/12* (2006.01)

(56) References Cited

U.S. PATENT DOCUMENTS

2019/0051502 A1* 2/2019 Asakura ............ H01J 37/32926
2019/0096659 A1   3/2019 Xu et al.

FOREIGN PATENT DOCUMENTS

| | | |
|---|---|---|
| JP | 2014-514727 A | 6/2014 |
| JP | 2015-520508 A | 7/2015 |
| JP | 2017-536584 A | 12/2017 |
| JP | 2018-504772 A | 2/2018 |
| WO | 01/18845 A1 | 3/2001 |
| WO | 2012/112959 A1 | 8/2012 |
| WO | 2013/162855 A1 | 10/2013 |
| WO | 2016/086138 A1 | 6/2016 |
| WO | 2016/090013 A1 | 6/2016 |

\* cited by examiner

E/R=−a#2+b#7−c#22+d

| FORMULA UNITS | SENSITIVITY |
|---|---|
| #2_NORMALIZED_309.0nm | 0.486349 |
| #7_NORMALIZED_389.0nm | 0.220971 |
| #22_NORMALIZED_501.5nm | 0.29268 |
| REGRESSION | |
| R Square | 0.871697 |
| RMSE | 0.950923 |
| MAPE | 1.975158 |

E/R = +a#11−b#12−c#26+d#29+e

| FORMULA UNITS | SENSITIVITY |
|---|---|
| #11_NORMALIZED_419.0nm | 0.260402 |
| #12_NORMALIZED_434.0nm | 0.285831 |
| #26_NORMALIZED_526.0nm | 0.147369 |
| #29_NORMALIZED_656.5nm | 0.306398 |
| REGRESSION | |
| R Square | 0.907284 |
| RMSE | 0.808359 |
| MAPE | 1.778905 |

LEARNING METHOD, MANAGEMENT DEVICE, AND MANAGEMENT PROGRAM

CROSS-REFERENCE TO RELATED APPLICATIONS

This application claims priority to Japanese Patent Application No. 2019-086216 filed on Apr. 26, 2019, the entire contents of which are incorporated herein by reference.

TECHNICAL FIELD

The present disclosure relates to a learning method, a management device, and a management program.

BACKGROUND

Advanced process control (APC)/advanced equipment control (AEC) for controlling device parameters is suggested to suppress time-series changes of a plasma processing apparatus. In order to automatically control the device parameters, it is suggested to machine-learn data of various sensors of the plasma processing apparatus.

PRIOR ART

Patent Document 1: Japanese Patent Application Publication No. 2014-514727
Patent Document 2: Japanese Patent Application Publication No. 2017-536584

The present disclosure provides a learning method, a management device, and a management program which are capable of accurately and effectively generating a regression equation.

SUMMARY

In accordance with an aspect of the present disclosure, there is provided a learning method including: performing preprocessing on light emission data in a chamber of a plasma processing apparatus; setting a constraint in machine learning for generating a regression equation representing a relationship between an etching rate in the plasma processing apparatus and the light emission data; selecting a learning target wavelength from the light emission data subjected to the preprocessing; receiving selection of other sensor data different from the light emission data; generating a regression equation by performing the machine learning based on the set constraint while using, as learning data, the selected wavelength, the received other sensor data, and the etching rate; and outputting the generated regression equation.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a learning method, a management device, and a management program will be described in detail with reference to the accompanying drawings. The following embodiments are not intended to limit the present disclosure.

In the case of handling data of various sensors of the plasma processing apparatus by using a machine learning method, a regression equation (a model for estimating the state of plasma) that links an etching result with light emission data in a chamber of the plasma processing apparatus may be generated. The regression equation is an equation for predicting the most probable value of one variable from the known value of another, by using an algorithm that increases accuracy by recursive learning. Examples of the regression equation may be, e.g., principal component regression, partial least squares regression, or the like. These can perform recursive search while using an equation structure or a coefficient that minimizes a cost as an optimal solution. The light emission data is obtained by an optical emission sensor (OES) and is generally used for detecting an end point of etching. In the case of using the light emission data for estimating the condition of the chamber, an actinometry method capable of quantitatively measuring an atom density or a line intensity ratio method for estimating an electron temperature is used.

In general, a regression equation is generated by one of the following two methods. First, a regression coefficient of a regression equation is identified by selecting a reference wavelength and assigning experimental weight on the reference wavelength in view of a model related to an etching process and light emission. Second, a regression coefficient of a regression equation is identified by mathematical and automatic assignment of weight from a large amount of past processing data without selecting a reference wavelength.

In the first method, the regression equation can be generated with a relatively small number of data. However, the estimation accuracy of the regression equation obtained from a single excitation species and a single wavelength may by sufficient for a certain physical phenomenon but may not be sufficient for various physical phenomena. In the second method, high estimation accuracy can be obtained for various physical phenomena. However, a relatively large number of data is required for the identification based on past data. If the quality and the quantity of the data are not enough, overfitting may occur. In addition, since a generated regression equation tends to be complex and difficult to understand, there remains a doubt over the credibility of the model. Therefore, it is expected to accurately and effectively generate a regression equation.

(Configuration of Processing System 1)

Figure 1:
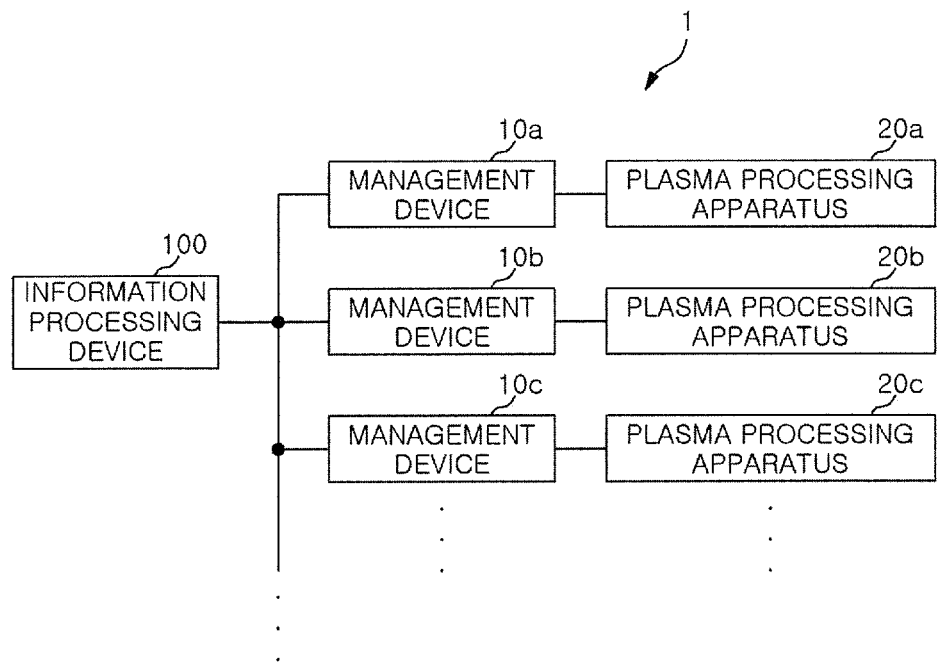
FIG. 1 is a block diagram showing an example of a processing system according to an embodiment.

FIG. 1 is a block diagram showing an example of a processing system according to an embodiment of the present disclosure. As shown in FIG. 1, a processing system 1 includes a plurality of management devices 10, a plurality of plasma processing apparatuses 20, and an information processing device 100. The management devices 10a to 10c and the plasma processing apparatuses 20a to 20c shown in FIG. 1 will be simply referred to as "the management device 10" and "the plasma processing apparatus 20", respectively, unless particularly distinguished.

The management devices 10 respectively manage the plasma processing apparatuses 20. The management devices 10 manage the state of the plasma processing apparatuses 20 connected thereto and receive information such as light emission data and data of various sensors from the plasma processing apparatuses 20. The management devices 10 transmit the acquired various information to the information processing device 100. Further, the management devices 10 estimate an etching rate based on the regression equation received from the information processing device 100 and various information received from the plasma processing apparatuses 20. The management devices 10 control the plasma processing apparatuses 20 based on the estimated etching rate.

The plasma processing apparatuses 20 perform plasma processing on substrates (hereinafter, referred to as "wafers") as processing targets. The plasma processing apparatuses 20 transmit the information such as the light emission data and the data of various sensors during the plasma processing to the management devices 10. Further, the plasma processing apparatuses 20 receive control signal from the management devices 10.

The information processing device 100 receives the information such as the light emission data and the data of various sensors from the management devices 10. The information processing device 100 generates a regression equation based on the received information. The information processing device 100 transmits the generated regression equation to the management devices 10.

(Etching Rate and Light Emission Data)

Figure 2:
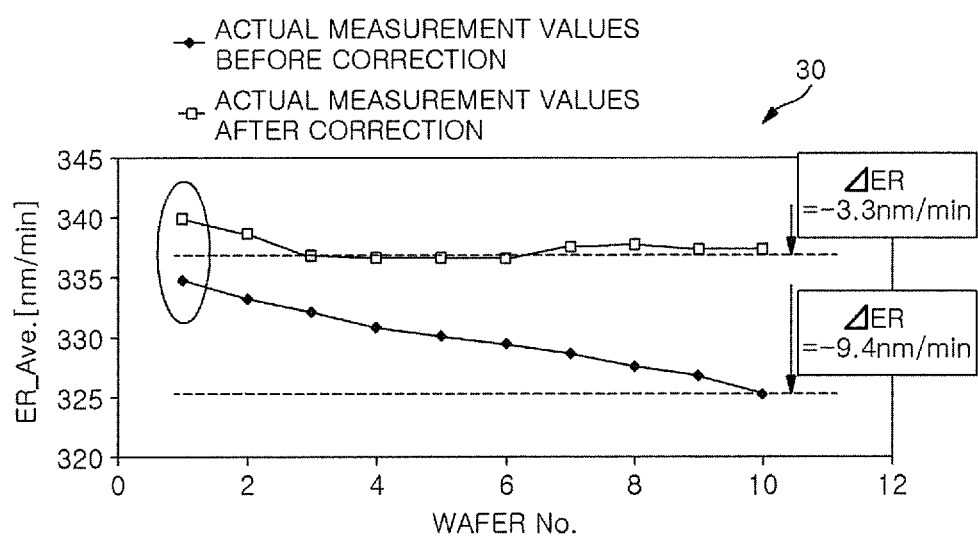
FIG. 2 shows an example of changes in an etching rate in a half lot.

Here, the etching rate and the light emission data will be explained. FIG. 2 shows an example of changes in an etching rate in a half lot. A graph 30 shown in FIG. 2 shows actual measurement values before and after correction of the changes in the etching rate in the case of processing 10 wafers corresponding to a half lot. As shown in FIG. 2, in the graph of the actual measurement values before correction, the etching rate is decreased as the number of processed wafers is increased. The decrease in the etching rate is due to contamination in the chamber and can be recovered by performing cleaning using a cleaning gas whenever processing of a half lot or one lot is completed. On the other hand, in the graph of the actual measurement values after correction, the decrease in the etching rate is suppressed by adjusting the processing gas, e.g., by increasing the flow rate of the processing gas during the processing of the half lot. In the present embodiment, such control is performed using the regression equation of the management devices 10.

Figure 3:
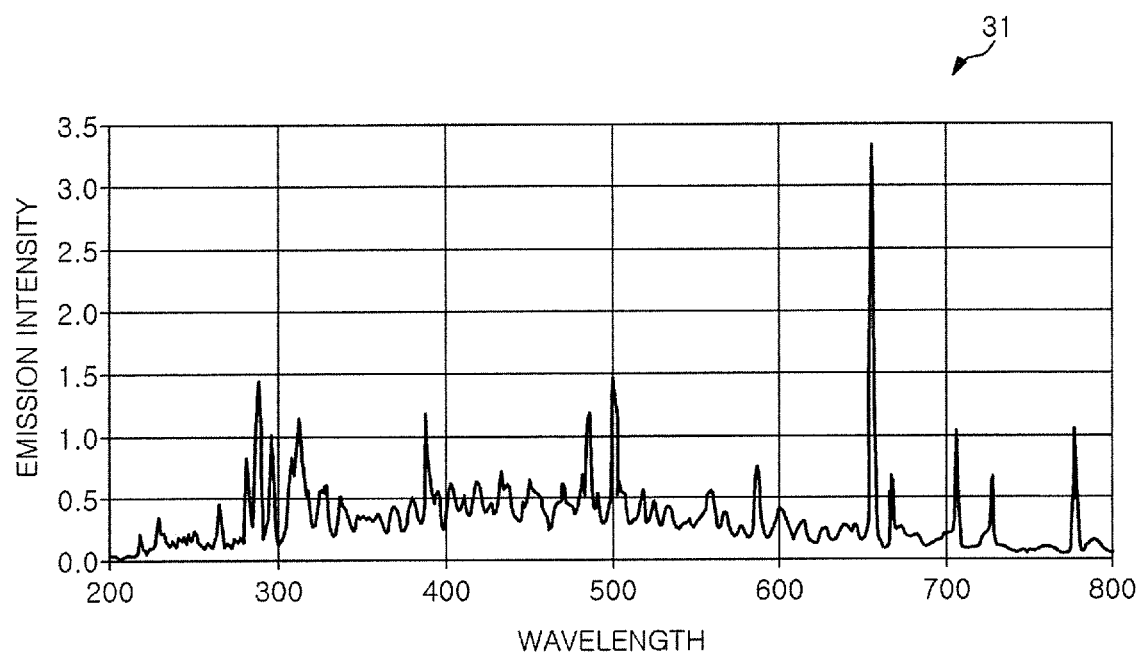
FIG. 3 shows an example of light emission data.

FIG. 3 shows an example of the light emission data. A graph 31 shown in FIG. 3 shows an emission intensity for each wavelength in the case of performing plasma processing on a certain wafer. In the example of the graph 31, the peak of the emission intensity is observed near 660 nm. Such a peak shows that a specific substance was detected.

Figure 4:
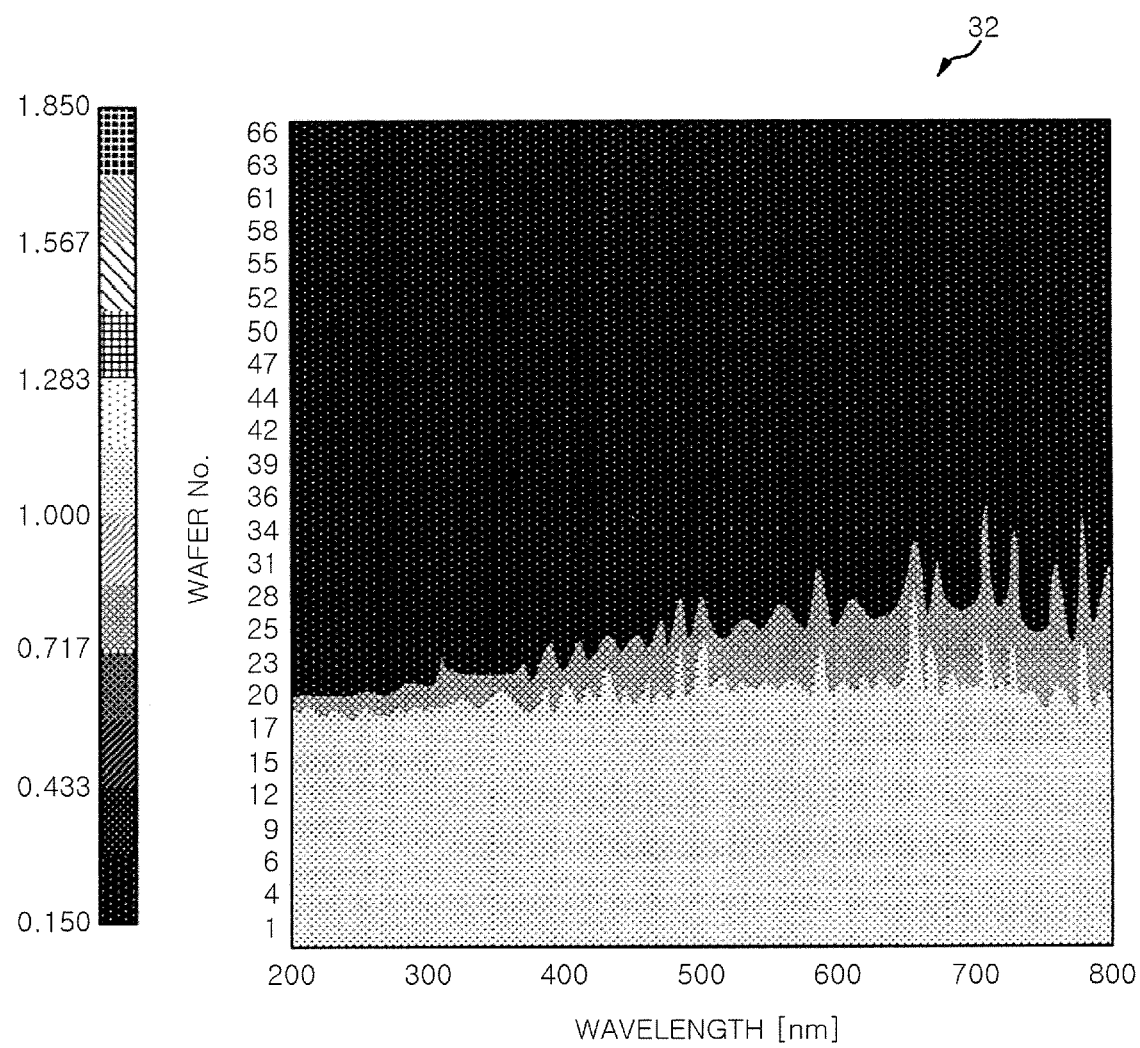
FIG. 4 shows an example of time-series changes of the light emission data.

FIG. 4 shows an example of time-series changes of the light emission data. A graph 32 shown in FIG. 4 shows the time-series changes of wavelengths (1201 wavelengths) of wafer No. 1 to wafer No. 66. The graph 32 shows a fluctuation rate of a time integration value of the light emission intensity per a single wafer by the classification (colors or the like) shown in the leftmost scale bar. In other words, the graph 32 is obtained by summing 66 graphs shown in FIG. 3. In the example of the graph 32, when the wafer No. exceeds 20, the light emission intensity is decreased and time-series changes are observed. In other words, the graph 30 and the graph 32 show that the decrease in the etching rate and the decrease in the emission intensity are correlated.

(Configuration of Information Processing Apparatus 100)

Figure 5:
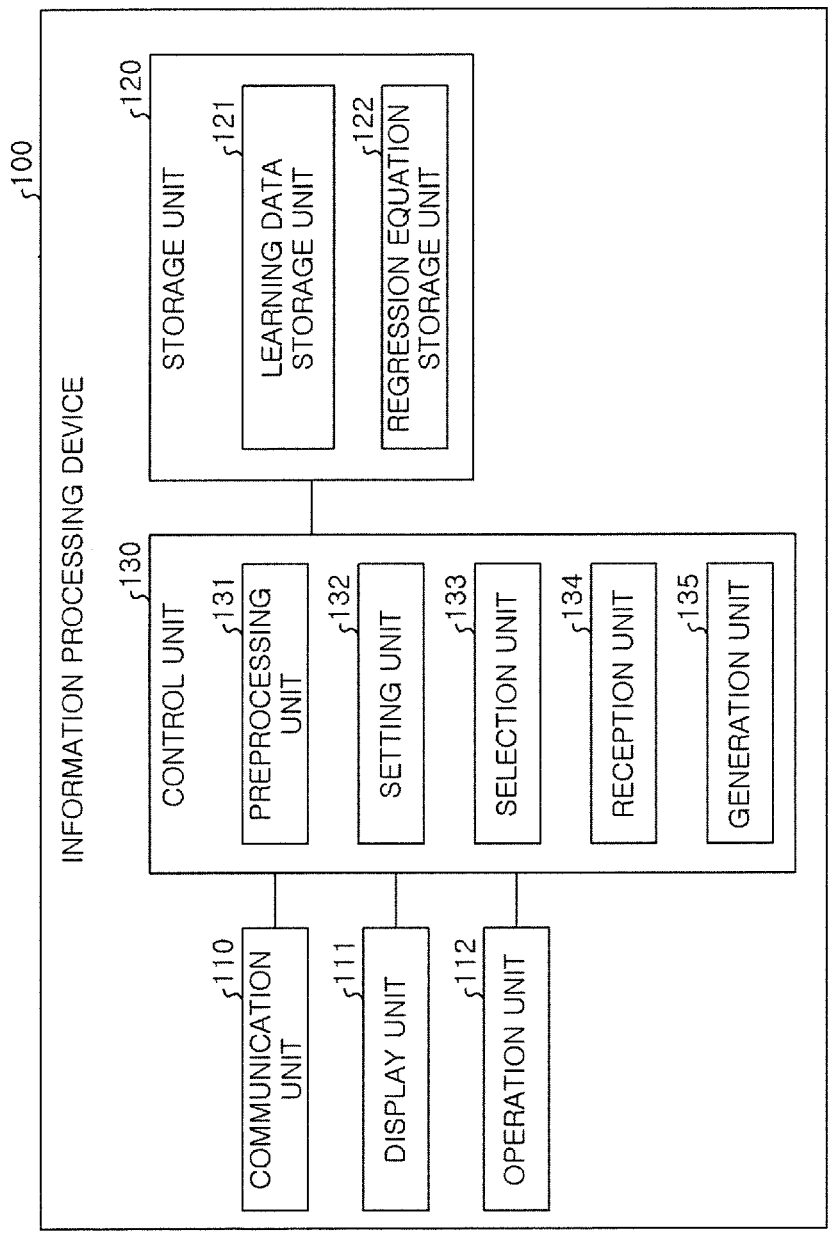
FIG. 5 is a block diagram showing an example of an information processing device according to an embodiment.

FIG. 5 is a block diagram showing an example of the information processing device according to an embodiment of the present disclosure. As illustrated in FIG. 5, the information processing device 100 includes a communication unit 110, a display unit 111, an operation unit 112, a storage unit 120, and a control unit 130. The information processing device 100 may include known various functional units of a computer, in addition to the functional units shown in FIG. 5, such as various input devices, audio output devices, and the like.

The communication unit 110 is realized by, e.g., a network interface card (NIC). The communication unit 110 is a communication interface that is connected by wire or wirelessly to the management devices 10 through a network and manages communication of information with the management devices 10. The communication unit 110 receives information such as light emission data and data of various sensors from the management devices 10. The communication unit 110 outputs the information such as the received light emission data and the data of various sensors to the control unit 130. Further, the communication unit 110 transmits the regression equation inputted from the control unit 130 to the management devices 10.

The display unit 111 is a display device for displaying various information. The display unit 111 is realized by, e.g., a liquid crystal display as a display device. The display unit 111 displays various screens such as display screens inputted from the control unit 130.

The operation unit 112 is an input device that receives various operations from a user of the information processing device 100. The operation unit 112 is realized by, e.g., a keyboard, a mouse, or the like as an input device. The operation unit 112 outputs the operation inputted by the user as operation information to the control unit 130. The operation unit 112 receives an input of an etching rate as learning data from the user. The operation unit 112 outputs the received etching rate to the control unit 130. The operation unit 112 may be realized by a touch panel or the like as an input device. The display device of the display unit 111 and the input device of the operation unit 112 may be integrated.

The storage unit 120 is realized by a storage device, e.g., a random access memory (RAM, a semiconductor memory element such as a flash memory or the like, a hard disk, an optical disk, or the like. The storage unit 120 includes a learning data storage unit 121 and a regression equation storage unit 122. The storage unit 120 stores information used for processing in the control unit 130.

The learning data storage unit 121 stores learning data for generating a regression equation. The learning data storage unit 121 stores the information, e.g., the light emission data, the data of various sensors, the etching rate, or the like, as the learning data.

The regression equation storage unit 122 stores the regression equation, i.e., a plasma state estimation model, generated as a result of machine learning. In the present embodiment, the regression equation is limited to a linear polynomial expression so that the model can be interpreted by human. The regression equation is expressed by the following Eq. (1).

$$E/R = a\text{OES \#1} + b\text{OES \#2} + \ldots + z \tag{1}$$

Here, E/R represents an etching rate; a to z represent regression coefficients; and OES #x represents a wavelength of light emission data.

The control unit 130 is realized by a central processing unit (CPU), a micro processing unit (MPU), a graphics processing unit (GPU), or the like in which a program stored in an internal storage device thereof is executed using a RAM as a work area. Further, the control unit 130 may be realized by, e.g., an integrated circuit such as an application specific integrated circuit (ASIC), a field programmable gate array (FPGA) or the like.

The control unit 130 includes a preprocessing unit 131, a setting unit 132, a selection unit 133, a reception unit 134, and a generation unit 135. The control unit 130 realizes or executes information processing functions or operations to be described below. The internal configuration of the control unit 130 is not limited to that shown in FIG. 5. The control unit 130 may have other configurations as long as the information processing to be described below can be performed.

The preprocessing unit 131 stores in the learning data storage unit 121, as learning data, the information such as the light emission data and the data of various sensors received from the management devices 10 and the information such as the inputted etching rate. The preprocessing unit 131 refers to the learning data storage unit 121 to perform a smoothing process on the light emission data. The preprocessing unit 131 performs, as the smoothing process, a moving average smoothing process in a time axis direction to average the fluctuation of the light emission over time. The preprocessing unit 131 adjusts the difference between the sensors after the smoothing process. The preprocessing unit 131 performs gain adjustment for a light emission ratio unit $g_n$ and an overall light emission ratio $g_{total}$, and overall offset adjustment $O_{total}$ using the following Eq. (2). Here, a regression coefficient is set to $a_n$ and a sensor value (light emission ratio) is set to $t_n$. Further, the preprocessing unit 131 applies a Z-Score in view of non-dimensionalization of units between the sensors, invalidation of the emission intensity difference between wavelengths, and re-scaling for sample number.

$$y = g_{total}(g_0 a_0 t_0 + \ldots + g_n a_n t_n) + o_{total} \tag{2}$$

The preprocessing unit 131 presents to a user normalized wavelength candidates for an actinometry method and receives user's selection. The normalized wavelength candidates include wavelength candidates for rare gases. The preprocessing unit 131 presents, e.g., He, Ar, Kr, Xe, and the like, as the normalized wavelength candidates. The preprocessing unit 131 converts the light emission intensity to the light emission ratio by dividing the light emission data by the selected normalized wavelength. The preprocessing unit 131 stores the light emission data converted to the light emission ratio in the learning data storage unit 121. When the preprocessing is completed, the preprocessing unit 131 outputs a setting instruction to the setting unit 132.

When the setting instruction is inputted from the preprocessing unit 131, the setting unit 132 sets a constraint in machine learning that generates a regression equation. The setting unit 132 selects weight of a variable increase cost as the constraint. The setting unit 132 adjusts the weight of the variable increase cost with a coefficient of a regularization term ($\lambda \|x\|1$) of a minimization problem as shown in the following Eq. (3). $\lambda$ satisfies a condition $0 < \lambda < 1$. "Ax−b" in the Eq. (3) indicates an estimation error that needs to be minimized in the regression equation.

$$\min_{x \in R^n} \frac{1}{2} \|Ax - b\|_2^2 + \lambda \|x\|_1 \tag{3}$$

Next, the setting unit 132 sets, as a constraint, a target match rate that is a goal setting for the machine learning. The target match rate (fitness) is a normalized non-linear target match rate that becomes close to 1 when a regression residual is minimum, and is defined by, e.g., the following Eq. (4). The target match rate (fitness) satisfies a condition $0 < \text{fitness} < 1$.

$$\text{fitness} = \frac{1}{1 + \|Ax - b\|_2^2} \tag{4}$$

The setting unit 132 sets, as a constraint, a maximum number of searches that is the goal setting for the machine learning. This is because the minimization problem is recursively solved by the machine learning, but may not be matched with the target. The maximum number of searches (IterationMax) satisfies a condition $1 < \text{IterationMax} < 10000$. After the constraint is set, the setting unit 132 outputs the set constraint information to the generation unit 135 and outputs a selection instruction to the selection unit 133.

When the selection instruction is inputted from the setting unit 132, the selection unit 133 refers to the learning data storage unit 121 to extract emission peak wavelengths from the light emission data converted to the light emission ratio. The selection unit 133 excludes, from the extracted wavelengths, a wavelength of which the average value of the light emission ratio is smaller than or equal to a first threshold value on a low light emission side or a wavelength of which the average value of the light emission ratio is greater than or equal to a second threshold value on a high light emission side. The first threshold value may be, e.g., a noise level. The second threshold value may be, e.g., an upper limit value of a dynamic range. In other words, the selection unit 133 excludes a wavelength having a poor S/N (Signal/Noise) ratio or a wavelength that is saturated to distort sensitivity. The selection unit 133 selects, as a learning target wavelength, an emission peak wavelength having a light emission ratio within a predetermined range among, e.g., 1201 wavelengths. After the learning target wavelength is selected, the selection unit 133 outputs the selected wavelength information to the generation unit 135 and outputs a reception instruction to the reception unit 134. In selecting the learning target wavelength, the selection unit 133 may delete an uninterpretable excitation type unknown wavelength that does not fit into a previously prepared list of interpretable wavelengths from the extracted emission peak wavelengths.

When the reception instruction is inputted from the selection unit 133, the reception unit 134 presents a list of candidate sensors to a user and receives the user's selection of a signal from a sensor other than an optical emission sensor (OES). The candidate sensors may be, e.g., Vpp, Current, RF Mag, RF Phase, and the like for expressing an ion collision speed, a number of ions, an electron density, and sheath thickness information. Further, the reception unit 134 generates, from the candidate sensors, a composite sensor such as a non-linear term using a square value of one sensor, an interference term using a multiplication value between two sensors, and a normalization term using a division value between two sensors. The reception unit 134 can put the user's knowledge into machine learning by using the composite sensor. The reception unit 134 outputs the received signal from the sensor other than OES or the composite sensor to the generation unit 135 as additional sensor information.

The generation unit 135 receives the constraint information from the setting unit 132, the wavelength information from the selection unit 133, and the additional sensor information from the reception unit 134. The generation unit 135 acquires the etching rate from the learning data storage unit 121 and initializes a sparse model of the machine learning using the acquired etching rate, the inputted constraint information, the wavelength information and the additional sensor information, thereby performing first machine learning. The generation unit 135 evaluates the sparse model subjected to the machine learning. The sparse model is evaluated by the following Eqs. (5) to (10).

$$Ax = b \tag{5}$$

$$A = \begin{bmatrix} 1 & t_{1n} \\ \vdots & \vdots \\ 1 & t_{mn} \end{bmatrix}, x = \begin{bmatrix} a_0 \\ \vdots \\ a_n \end{bmatrix}, b = \begin{bmatrix} y_1 \\ \vdots \\ y_m \end{bmatrix} \tag{6}$$

$$\min_{x \in R^n} \frac{1}{2} \|Ax - b\|_2^2 + \lambda \|x\|_0 \tag{7}$$

$$\|x\|_0 \stackrel{\Delta}{=} X \tag{8}$$

$$\min_{x \in R^n} \frac{1}{2} \|Ax - b\|_2^2 + \lambda \|x\|_1 \tag{9}$$

$$\|x\|_1 \stackrel{\Delta}{=} \sum_{i=1}^{n} |X_i| \tag{10}$$

The Eqs. (5) and (6) are simultaneous equations in the sparse modeling. A matrix A represents preprocessed sensor signal values (light emission ratio). A matrix x represents regression coefficients. A matrix b represents etching rates. The cost due to increase of the number of elements is defined, as a ridge regression minimization problem (L0 regularization), by the Eq. (7). In the Eq. (7), $\|x\|_0$ is defined as the number of non-zero elements in the Eq. (8). The cost due to increase of the regression coefficient is defined, as a LASSO minimization problem (L1 regularization), by the Eq. (9). In the Eq. (9), $\|x\|_1$ is defined by the Eq. (10).

The above-described sparse model was constructed with a mathematical goal for specifying a series of systems for understanding a plasma state from population balance of multiple energy levels based on a collisional radiation model that considers dissociative excitation (local thermal equilibrium state). These can be realized by simultaneous equations of population balance.

The actinometry method is based on a corona model (loss due to electron collision excitation and radiation only). The actual process plasma is in a state between the corona state and the local thermal equilibrium state (equilibrium by ionization, recombination, excitation, and deexcitation), which is not sufficient. On the other hand, in the electron temperature estimation using the two-line intensity ratio method, the emission ratio of two wavelengths of the same excited species (rare gas) is sufficient. Since, however, it is necessary to know the electron energy distribution to discuss the ion energy, it is considered that the integrated value of the electron energy distribution function (EEDF) of each energy level contributes to the ion etching.

Originally, the population balance should be evaluated for each energy level. However, this requires a high-precision OES (optical emission sensor) and enormous verification time. On the other hand, in the machine learning of the present embodiment, these processes can be skipped and the plasma state can be identified broadly in a recursive manner from the emission balance of the OES.

The generation unit 135 determines whether or not the target match rate satisfies a predetermined value as a result of the evaluation. When it is determined that the target match rate does not satisfy the predetermined value, the generation unit 135 updates the sparse model based on the search algorithm and performs recursive learning. A genetic programming method is used as an example of the search algorithm. When the sparse model is updated, the generation unit 135 returns to the evaluation of the sparse model.

When it is determined that the target match rate satisfies the predetermined value, the generation unit 135 generates a regression equation based on the regression coefficient matrix x, and stores the generated regression equation in the regression equation storage unit 122. Further, the generation unit 135 outputs the generated regression equation to the communication unit 110 and transmits the regression equation to the management device 10 through the communication unit 110.

(Learning Method)

Figure 6:
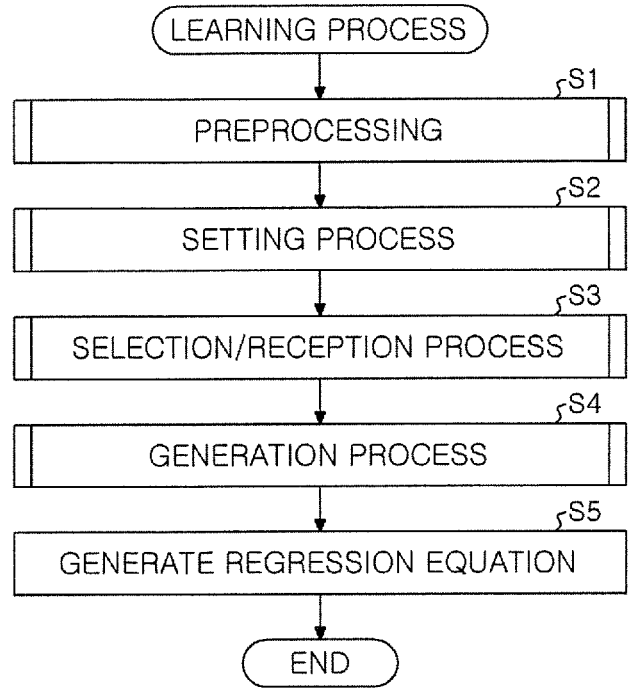
FIG. 6 is a flowchart showing an example of learning processing according to the embodiment.

Next, the operation of the information processing device 100 of the present embodiment will be described. FIG. 6 is a flowchart showing an example of the learning process in the present embodiment.

The preprocessing unit 131 of the information processing device 100 stores, as the learning data, the information such as the light emission data and the data of various sensors received from the management devices 10 and the information such as the inputted etching rate in the learning data storage unit 121. When the learning data is prepared, the preprocessing unit 131 performs the preprocessing (step S1).

Figure 7:
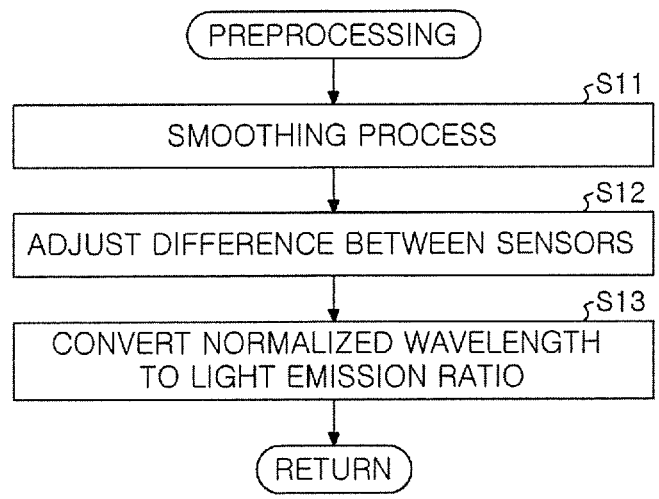
FIG. 7 is a flowchart showing an example of preprocessing according to the embodiment.

Here, the preprocessing will be described with reference to FIG. 7. FIG. 7 is a flowchart showing an example of the preprocessing in the present embodiment.

The preprocessing unit 131 refers to the learning data storage unit 121 to perform a smoothing process on the light emission data (step S11). The preprocessing unit 131 adjusts the difference between the sensors after the smoothing process (step S12). The preprocessing unit 131 presents to a user normalized wavelength candidates for the actinometry method and receives user's selection. The preprocessing unit 131 converts the selected normalized wavelength to the light emission ratio (step S13). The preprocessing unit 131 stores the light emission data converted to the light emission ratio in the learning data storage unit 121. When the preprocessing is completed, the preprocessing unit 131 outputs a setting instruction to the setting unit 132 and returns to the original processing.

Figure 8:
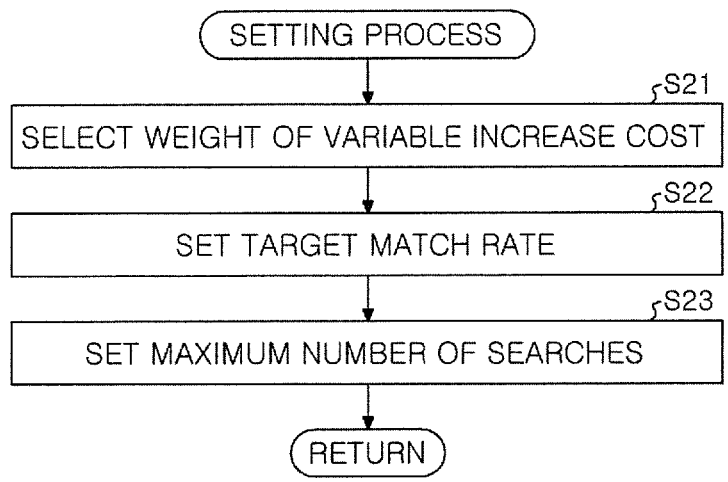
FIG. 8 is a flowchart showing an example of a setting process according to the embodiment.

Referring back to FIG. 6, when the setting instruction is inputted from the preprocessing unit 131, the setting unit 132 performs a setting process (step S2). Here, the setting process will be described with reference to FIG. 8. FIG. 8 is a flowchart showing an example of the setting process in the present embodiment.

The setting unit 132 selects the weight of the variable increase cost as a constraint in machine learning that generates a regression equation (step S21). The setting unit 132 sets a target match rate as the constraint (step S22). The setting unit 132 sets a maximum number of searches as the constraint (step S23). After the constraints are set, the setting unit 132 outputs the set constraint information to the generation unit 135, outputs a selection instruction to the selection unit 133, and returns to the original processing.

Figure 9:
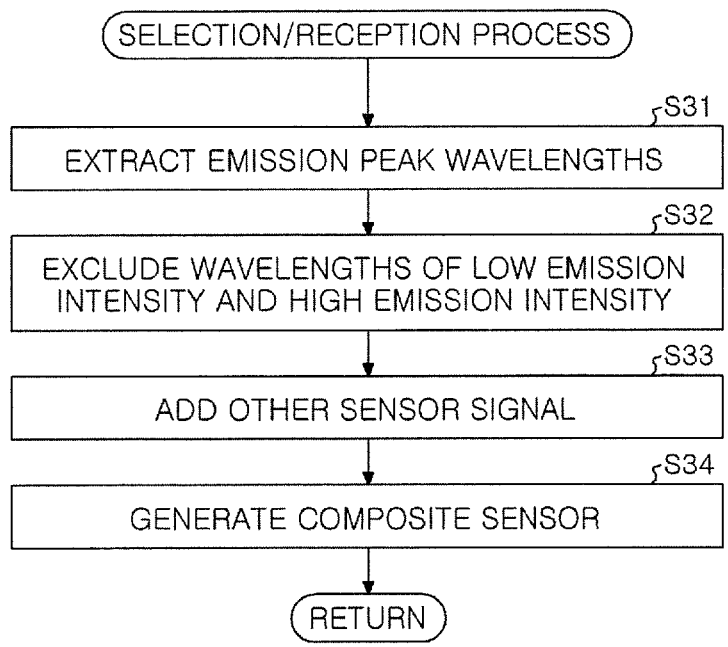
FIG. 9 is a flowchart showing an example of a selection/reception process according to the embodiment.

Referring back to FIG. 6, when the selection instruction is inputted from the setting unit 132, the selection unit 133 performs a selection/reception process (step S3). Here, the selection/reception process will be described with reference to FIG. 9. FIG. 9 is a flowchart showing an example of the selection/reception process in the present embodiment.

The selection unit 133 refers to the learning data storage unit 121 to extract emission peak wavelengths from the light emission data converted to the light emission ratio (step S31). The selection unit 133 excludes, from the extracted wavelengths, a wavelength of which the average value of the emission ratio is a low emission intensity (smaller than or equal to a first threshold value on a low emission side) and a wavelength of which the average value of the emission ratio is a high emission intensity (greater than or equal to a second threshold value on a high emission side) (step S32). The selection unit 133 selects wavelengths that are not excluded as learning target wavelengths. After the learning target wavelengths are selected, the selection unit 133 outputs the selected wavelength information to the generation unit 135 and outputs a reception instruction to the reception unit 134.

When the reception instruction is inputted from the selection unit 133, the reception unit 134 presents a list of candidate sensors to the user so that the user can select a sensor signal other than from the OES, receives the user's selection, and adds the user's selection as other sensor signal (step S33). Further, the reception unit 134 generates a composite sensor from the candidate sensors based on a user instruction (step S34). The receiving unit 134 outputs the received other sensor signal or the composite sensor as additional sensor information to the generation unit 135, and returns to the original processing.

Figure 10:
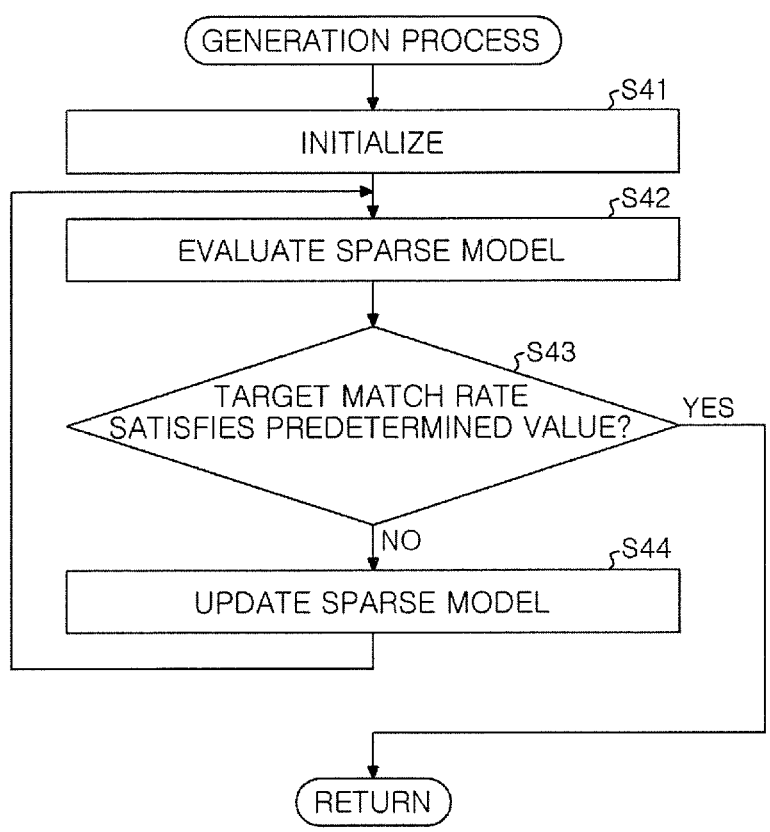
FIG. 10 is a flowchart showing an example of a generation process according to the embodiment.

Referring back to FIG. 6, when the additional sensor information is inputted from the reception unit 134, the generation unit 135 performs a generation process (step S4). Here, the generation process will be described with reference to FIG. 10. FIG. 10 is a flowchart showing an example of the generation process in the present embodiment.

The generation unit 135 acquires an etching rate from the learning data storage unit 121, initializes the sparse model of the machine learning using the acquired etching rate and the inputted constraint information, wavelength information, and additional sensor information, and performs the first machine learning (step S41). The generation unit 135 evaluates the sparse model subjected to the machine learning (step S42). The generation unit 135 determines whether or not a target match rate satisfies a predetermined value as a result of the evaluation (step S43). When it is determined that the target match rate does not satisfy the predetermined value (NO in step S43), the generation unit 135 updates the sparse model based on the search algorithm and perform recursive learning (step S44). Then, the processing returns to step S42. On the other hand, if it is determined that the target match rate satisfies the predetermined value (YES in step S43), the generation unit 135 returns to the original processing.

Referring back to FIG. 6, the generation unit 135 generates a regression equation based on the regression coefficient matrix x, and stores the generated regression equation in the regression equation storage unit 122. Further, the generation unit 135 outputs the generated regression equation to the communication unit 110, and transmits the regression equation to the management device through the communication unit 110 (step S5). Accordingly, the information processing device 100 can accurately and effectively generate the regression equation in an easily understandable format.

(Example of Regression Equation (Estimation Model))

Figure 11:
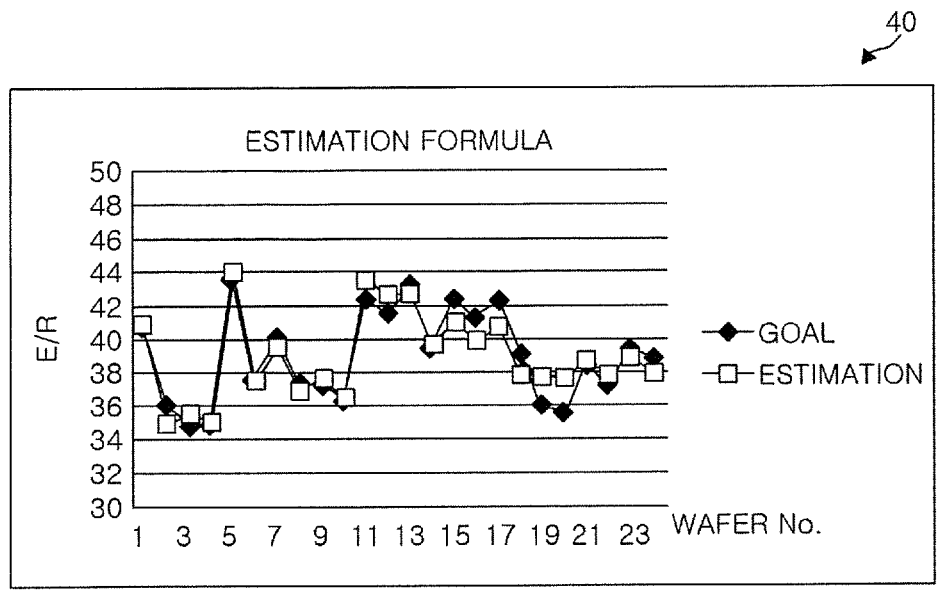
FIG. 11 shows an example of comparison between regression equation values and actual measurement values according to the embodiment.

FIG. 11 shows an example of comparison between the regression equation and the actual measurement values in the present embodiment. In the graph 40 of FIG. 11, the measured values (Goal) are substantially close to the estimated values (Estimation) obtained based on the regression equation. The regression equation 41 corresponding to the graph 40 shows that wavelengths #2, #7, and #22 among 33 wavelengths of the light emission data contribute to the etching rate. Table 42 shows details such as the constraints of the regression equation 41 and the like.

Figure 12:
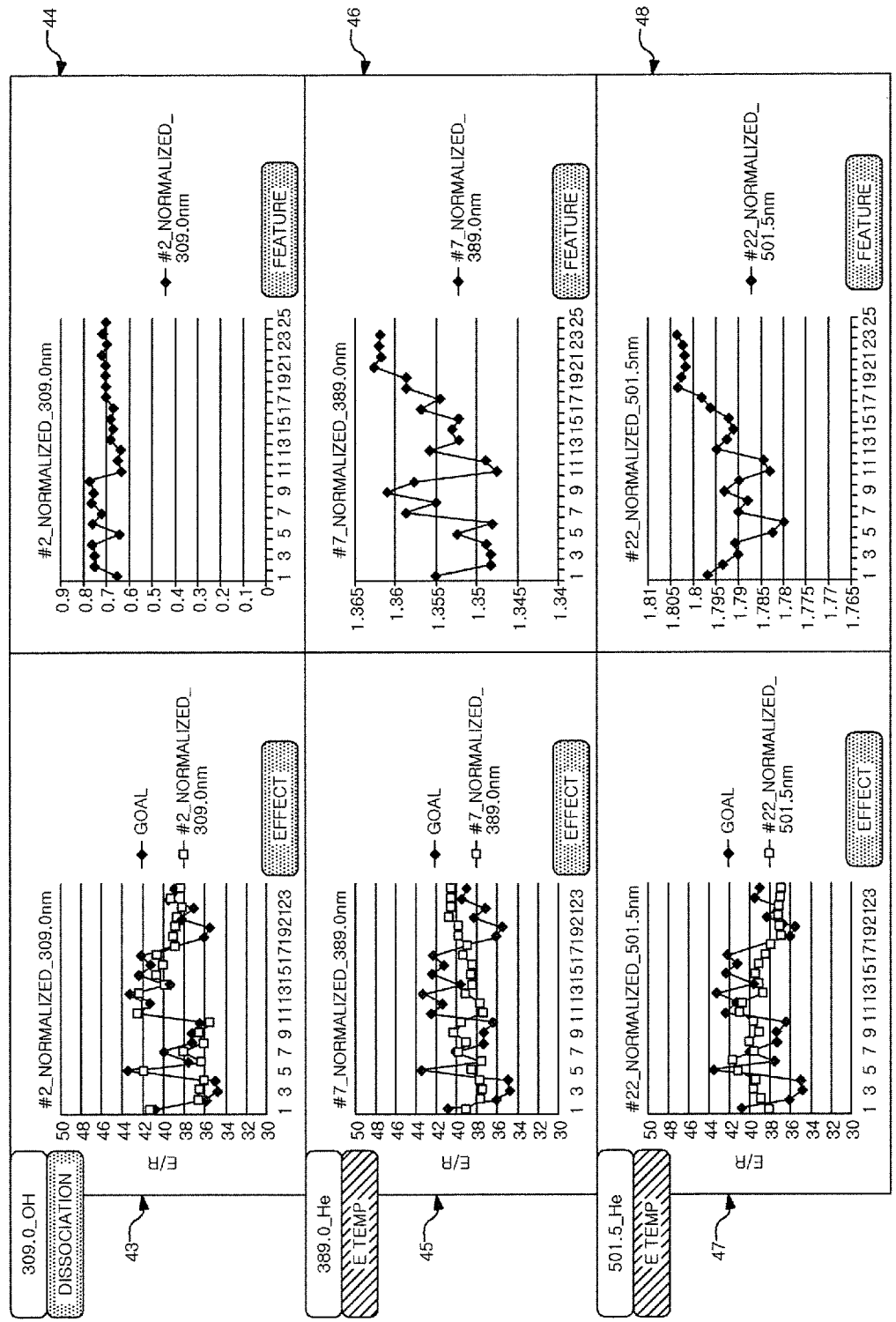
FIG. 12 explains examples of selected wavelengths of the regression equation according to the embodiment.

FIG. 12 explains examples of the selected wavelengths of the regression equation in the present embodiment. A graph 43 in FIG. 12 shows an estimation result of the etching rate from the wavelength #2. A graph 44 shows the emission ratio of the wavelength #2. A graph 45 shows the estimation result of the etching rate from the wavelength #7. A graph 46 shows the emission ratio of the wavelength #7. A graph 47 shows the estimation result of the etching rate from the wavelength #22. A graph 48 shows the emission ratio of the wavelength #22. Referring to the graphs 43 to 48, in the case of the graph 40, most of the fluctuations can be expressed by OH radicals of the wavelength #2, but some fluctuations cannot be expressed by the OH radicals of the wavelength #2. Therefore, the estimated values shown in the graph 40 are obtained by expressing the electron temperature fluctuations from the He emission ratios of the wavelengths #7 and #22 in addition to the wavelength #2. In other words, the regression equation 41 may be a model of electron temperature and electron density.

Figure 13:
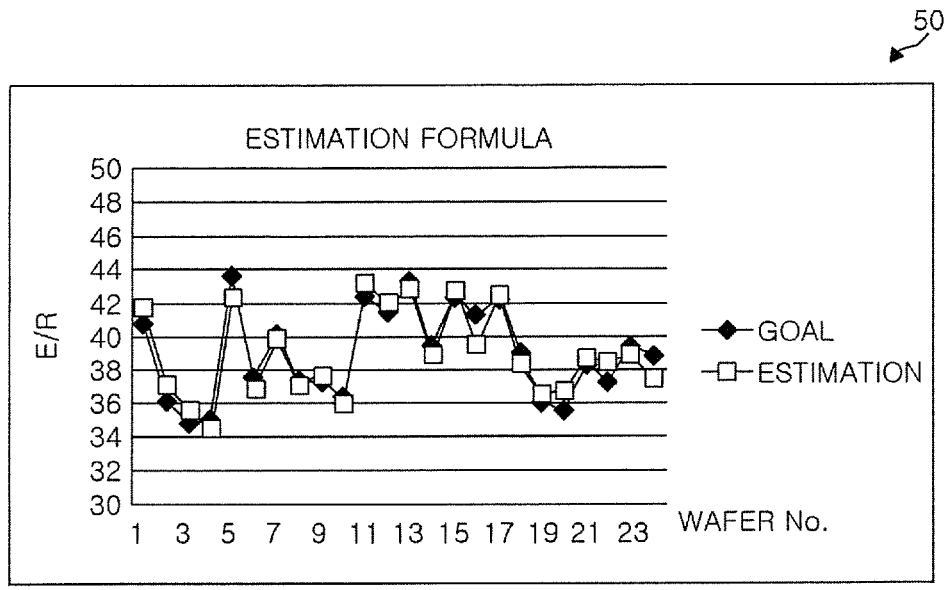
FIG. 13 shows another example of comparison between regression equation values and actual measurement values according to the embodiment.

FIG. 13 shows another example of comparison between the regression equation and the actual measurement values in the present embodiment. In the graph 50 of FIG. 13, the measured values (Goal) are substantially close to the estimated values (Estimation) obtained based on the regression equation. The regression equation 51 corresponding to the graph 50 shows that the wavelengths #11, #12, #26, and #29 among the 33 wavelengths of the light emission data contribute to the etching rate. Table 52 shows details such as regression statistics of the regression equation 51 and the like.

Figure 14:
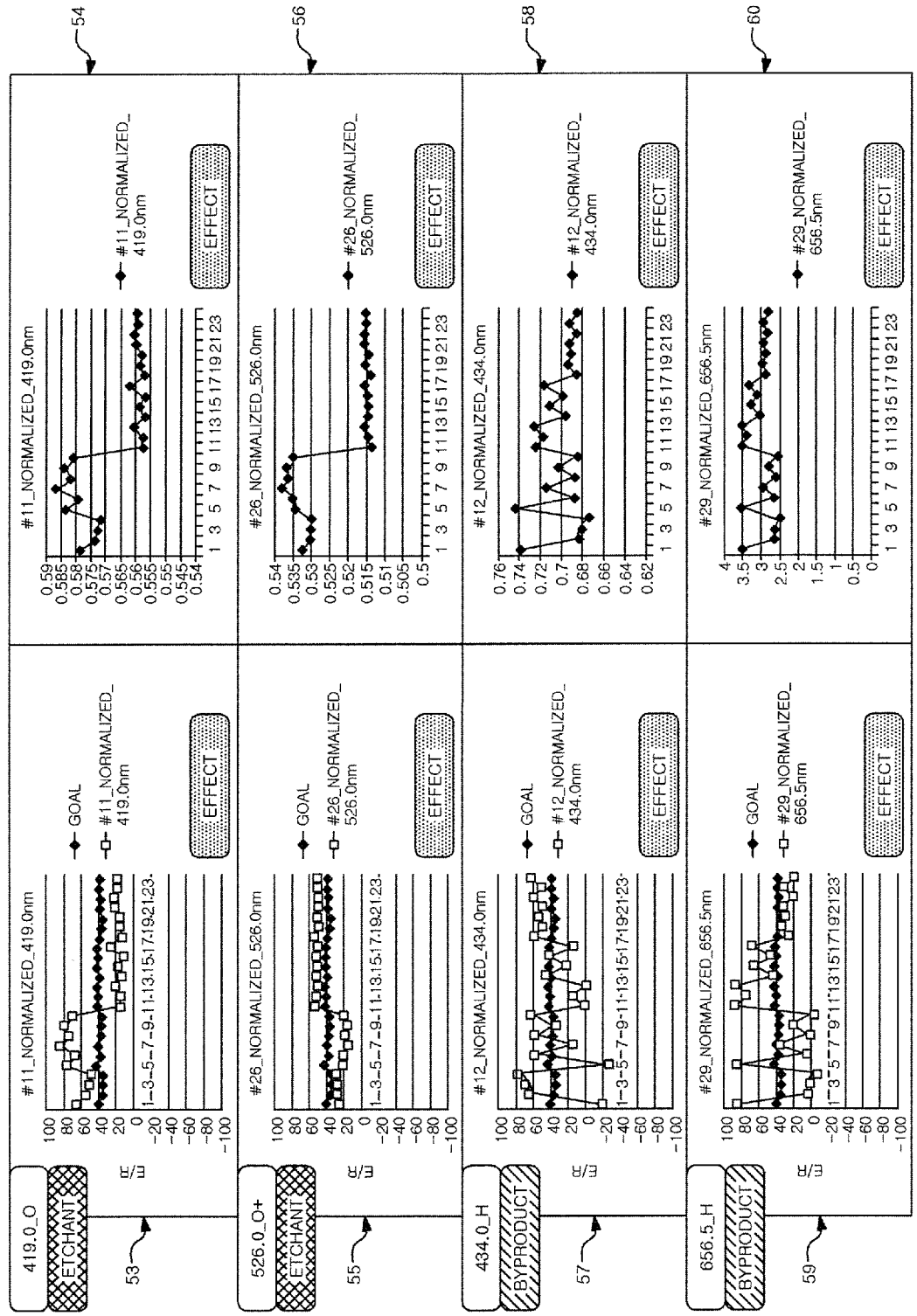
FIG. 14 explains other examples of selected wavelengths for the regression equation according to the embodiment.

FIG. 14 explains other examples of the selected wavelengths of the regression equation in the present embodiment. A graph 53 in FIG. 14 shows an estimation result of the etching rate from the wavelength #11. A graph 54 shows the emission ratio of the wavelength #11. A graph 55 shows the estimation result of the etching rate from the wavelength #26. A graph 56 shows the emission ratio of the wavelength #26. A graph 57 shows the estimation result of the etching rate from the wavelength #12. A graph 58 shows the emission ratio of the wavelength #12. A graph 59 shows the estimation result of the etching rate from the wavelength #29. A graph 60 shows the emission ratio of the wavelength

29. Referring to the graphs 53 to 60, in the case of the graph 50, O radicals and O ions are expressed by two types of O of the wavelengths #11 and #26, and the by-products and the electron temperature are expressed by two types of H of the wavelengths #12 and #29. Accordingly, the estimated values shown in the graph 50 are obtained. In other words, the regression equation 51 may be a comprehensive etching model.

(Modification)

Figure 15:
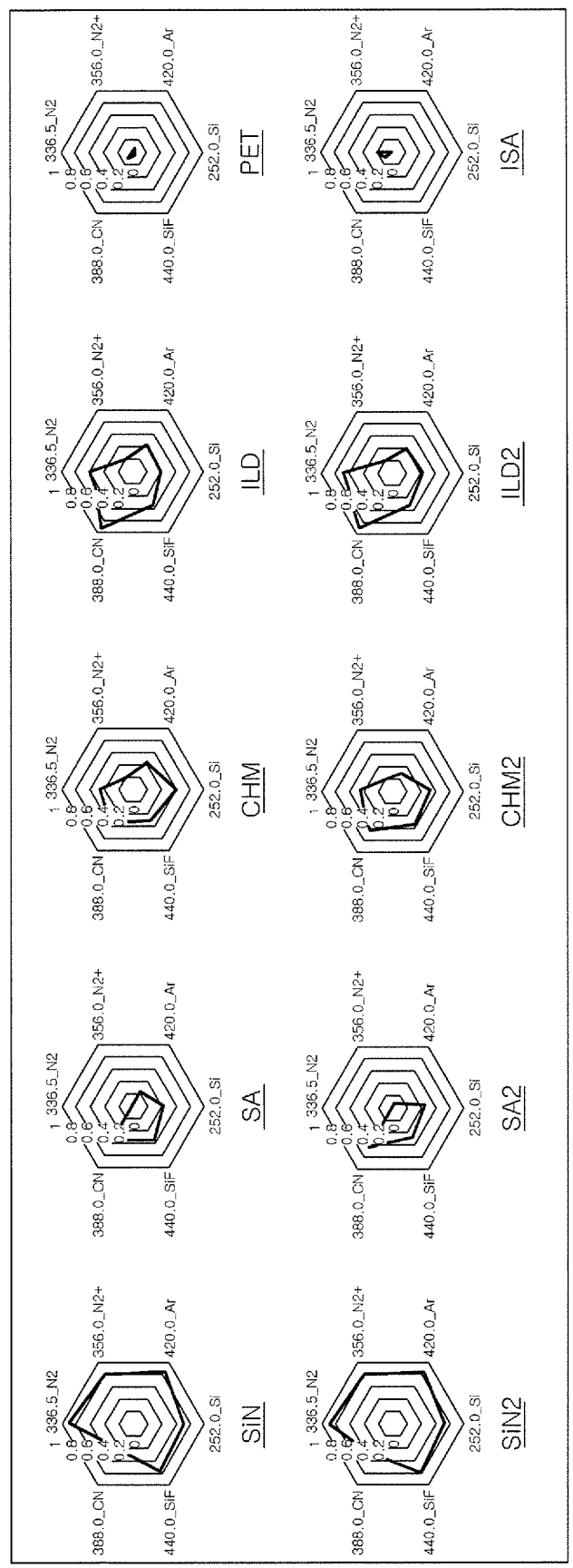
FIG. 15 shows an example of changes in light emission balance of the recipes previously used.

In the above embodiment, as an example of using the regression equation, the management devices 10 control the plasma processing apparatuses 20 based on the light emission data during the processing. However, the abnormality of the processing may be detected based on the light emission data during the processing. FIG. 15 shows an example of the changes in the emission balance according to types of recipes previously used. In the modification, a model (regression equation) is generated by machine learning the changes in the light emission amount (balance of multiple excited species) in the case of simulating a certain abnormal case shown in FIG. 15 in a pseudo manner. The management devices 10 or the plasma processing apparatuses 20 perform abnormality detection using the generated model when it is determined that the light emission data during the processing corresponds to an abnormal case.

As described above, in the present embodiment, the information processing device 100 performs the preprocessing on the light emission data in the chamber of the plasma processing apparatus 20. Further, the information processing device 100 sets a constraint in machine learning for generating a regression equation representing a relationship between the etching rate in the plasma processing apparatus 20 and the light emission data. Moreover, the information processing device 100 selects the learning target wavelength from the pre-processed light emission data. The information processing device 100 receives selection of other sensor data different from the light emission data. In addition, the information processing device 100 generates the regression equation by performing the machine learning based on the set constraint while using, as the learning data, the selected wavelength, the received other sensor data, and the etching rate. The information processing device 100 outputs the generated regression equation. Accordingly, the regression equation can be accurately and effectively generated.

In the present embodiment, the preprocessing is one or multiple processes that are selected among the smoothing process, the adjustment of the difference between the sensors, and the conversion of the normalized wavelength to the emission ratio in the actinometry method and performed for the light emission data. Accordingly, noise or the like can be removed from the light emission data.

In the present embodiment, the constraint is one or multiple constraints selected among the variable increase cost, the target match rate, and the maximum number of searches. Accordingly, the learning time of the machine learning can be shortened.

In the present embodiment, the information processing device 100 extracts emission peak wavelengths from the light emission data, and selects, from the extracted wavelengths, a wavelength other than a wavelength of which the average value of the light emission intensity is smaller than or equal to a first threshold value or a wavelength of which the average value of the light emission intensity is greater than or equal to a second threshold value. Accordingly, it is possible to exclude a wavelength having a poor S/N ratio or a wavelength that is saturated to cause sensitivity distortion.

In the present embodiment, the information processing device 100 generates one or multiple terms among a non-linear term, an interference term, and a normalized term based on the other sensor data, and receives selection of the generated term. Accordingly, the user's knowledge can be applied to the regression equation.

In the present embodiment, the regression equation is a linear polynomial, and thus can be understood by human.

In the present embodiment, the information processing device 100 performs the machine learning using the sparse modeling. Accordingly, a regression equation can be generated with a small number of wavelengths.

In the present embodiment, the sparse modeling uses a genetic programming method. Accordingly, the combination of the wavelengths in the regression equation can be extracted.

Further, in the present embodiment, the sparse modeling increases the cost depending on the number of elements or the regression coefficient. Accordingly, the learning time of the machine learning can be shortened.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

In the above-described embodiment, the management devices 10 control the processing or perform abnormality detection. However, the management devices 10 may estimate the amount of deposition in the chamber from the changes in the light emission data and perform cleaning until the changes in the amount of deposition becomes smaller than or equal to a predetermined value. Further, the management devices 10 may notify the timing of replacement of various parts such as a focus ring and the like based on the etching rate or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A learning method comprising:
    performing preprocessing on light emission data in a chamber of a plasma processing apparatus;
    setting a constraint in machine learning for generating a regression equation representing a relationship between an etching rate in the plasma processing apparatus and the light emission data;
    selecting a learning target wavelength from the light emission data subjected to the preprocessing;
    receiving selection of other sensor data different from the light emission data;
    generating a regression equation by performing the machine learning based on the set constraint while using, as learning data, the selected wavelength, the received other sensor data, and the etching rate; and
    outputting the generated regression equation.

2. The learning method of claim 1, wherein the preprocessing is one or multiple processes performed on the light emission data, the one or multiple processes being selected among a smoothing process, adjustment of a difference between sensors, and conversion of a normalized wavelength to a light emission ratio in an actinometry method.

3. The learning method of claim 2, wherein the constraint is one or multiple constraints selected among a variable increase cost, a target match rate, and a maximum number of searches.

4. The learning method of claim 3, wherein in said selecting, emission peak wavelengths are extracted from the light emission data, and a wavelength other than a wavelength of which an average value of a light emission intensity is smaller than or equal to a first threshold value or a wavelength of which the average value of the light emission intensity is greater than or equal to a second threshold value is selected from the extracted wavelengths.

5. The learning method of claim 2, wherein in said selecting, emission peak wavelengths are extracted from the light emission data, and a wavelength other than a wavelength of which an average value of a light emission intensity is smaller than or equal to a first threshold value or a wavelength of which the average value of the light emission intensity is greater than or equal to a second threshold value is selected from the extracted wavelengths.

6. The learning method of claim 2, wherein in said receiving, selection of one or multiple terms that are generated among a nonlinear term, an interference term, and a normalized term based on the other sensor data is received.

7. The learning method of claim 2, wherein the regression equation is a linear polynomial.

8. The learning method of claim 2, wherein in the generating, the machine learning is performed using a sparse modeling.

9. The learning method of claim 8, wherein the sparse modeling uses a genetic programming method.

10. The learning method of claim 1, wherein the constraint is one or multiple constraints selected among a variable increase cost, a target match rate, and a maximum number of searches.

11. The learning method of claim 10, wherein in said selecting, emission peak wavelengths are extracted from the light emission data, and a wavelength other than a wavelength of which an average value of a light emission intensity is smaller than or equal to a first threshold value or a wavelength of which the average value of the light emission intensity is greater than or equal to a second threshold value is selected from the extracted wavelengths.

12. The learning method of claim 1, wherein in said selecting, emission peak wavelengths are extracted from the light emission data, and a wavelength other than a wavelength of which an average value of a light emission intensity is smaller than or equal to a first threshold value or a wavelength of which the average value of the light emission intensity is greater than or equal to a second threshold value is selected from the extracted wavelengths.

13. The learning method of claim 1, wherein in said receiving, selection of one or multiple terms that are generated among a nonlinear term, an interference term, and a normalized term based on the other sensor data is received.

14. The learning method of claim 1, wherein the regression equation is a linear polynomial.

15. The learning method of claim 1, wherein in the generating, the machine learning is performed using a sparse modeling.

16. The learning method of claim 15, wherein the sparse modeling uses a genetic programming method.

17. The learning method of claim 16, wherein the sparse modeling increases a cost depending on a number of elements or a regression coefficient.

18. The learning method of claim 15, wherein the sparse modeling increases a cost depending on a number of elements or a regression coefficient.

19. A management device for managing a plasma processing apparatus using a regression equation,
wherein the regression equation is generated by performing preprocessing on light emission data in a chamber of the plasma processing apparatus, setting a constraint in machine learning for generating a regression equation representing a relationship between an etching rate in the plasma processing apparatus and the light emission data, selecting a learning target wavelength from the light emission data subjected to the preprocessing, receiving selection of other sensor data different from the light emission data, and performing the machine learning based on the set constraint while using, as learning data, the selected wavelength, the received other sensor data and the etching rate,
the management device comprising:
an estimation unit configured to estimate the etching rate of the plasma processing apparatus by applying the light emission data acquired from the plasma processing apparatus to the regression equation; and
a control unit configured to control the plasma processing apparatus based on the estimated etching rate.

20. A non-transitory computer-readable storage medium storing a management program for managing a plasma processing apparatus using a regression formula, wherein the regression formula is generated by performing preprocessing on light emission data in a chamber of the plasma processing apparatus, setting a constraint in machine learning for generating a regression equation representing a relationship between an etching rate in the plasma processing apparatus and the light emission data, selecting a learning target wavelength from the light emission data subjected to the preprocessing, receiving selection of other sensor data different from the light emission data, and performing the machine learning based on the set constraint while using, as learning data, the selected wavelength, the received other sensor data and the etching rate,
wherein the management program, when executed by a processor, causes a management device to estimate the etching rate of the plasma processing apparatus by applying the light emission data acquired from the plasma processing apparatus to the regression equation and to control the plasma processing apparatus based on the estimated etching rate.

* * * * *